United States Patent

Balyasny

[11] Patent Number: 5,942,905
[45] Date of Patent: Aug. 24, 1999

[54] CONTACT ARRANGEMENT

[75] Inventor: Marik Balyasny, Burbank, Calif.

[73] Assignee: ITT Corporation, New York, N.Y.

[21] Appl. No.: 08/448,234

[22] Filed: May 23, 1995

Related U.S. Application Data

[60] Division of application No. 08/061,097, May 14, 1993, Pat. No. 5,453,700, which is a continuation-in-part of application No. 07/893,181, Jun. 3, 1992, abandoned.

[51] Int. Cl.⁶ .......................... G01R 1/073; G01R 31/02
[52] U.S. Cl. ........................ 324/755; 324/754; 439/912
[58] Field of Search ........................ 324/755, 754; 439/65, 68, 70, 482, 912

[56] References Cited

U.S. PATENT DOCUMENTS 5,049,813  9/1991  Van Loan et al. ...................... 324/755

*Primary Examiner*—Ernest F. Karlsen
*Attorney, Agent, or Firm*—Freilich Hornbaker Rosen

[57] ABSTRACT

A connecting device is described for use in a test clip whose multiple contacts engage multiple leads of an IC (integrated circuit) device, which can be constructed reliably and at low cost. The test clip includes a flat flexible cable (54, FIG. 7) mounted on a clip housing, the cable having parallel conductors (50) mounted on insulation 53. Lower end portions of the conductors serve as lead-engaging contacts. Each conductor lower end portion extends in a substantially 180° loop (62), with one side (70) of each loop being positioned to engage a corresponding lead of the IC device.

9 Claims, 5 Drawing Sheets

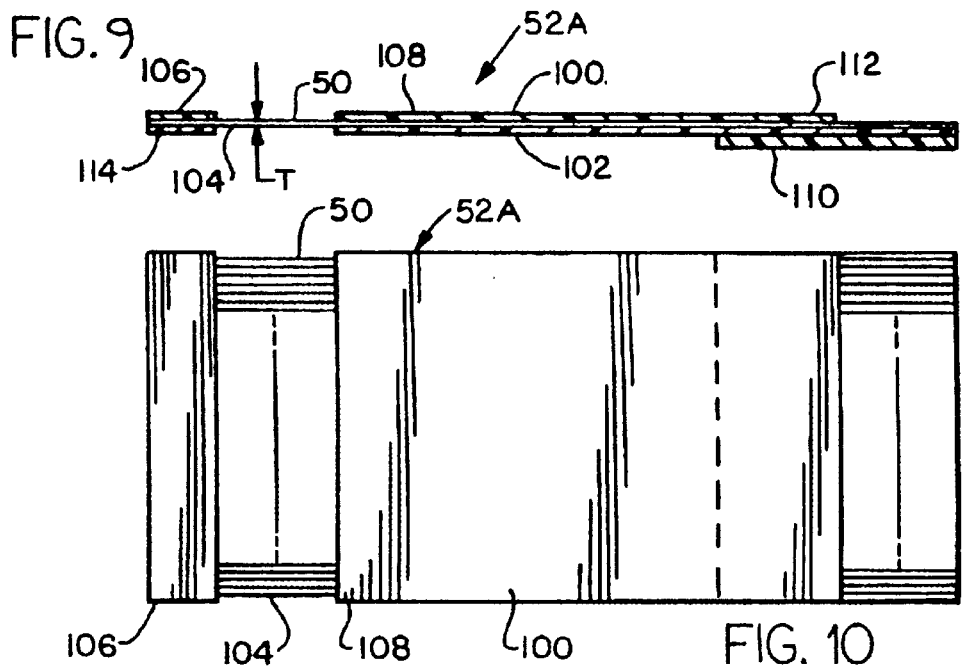
FIG. 9
FIG. 10
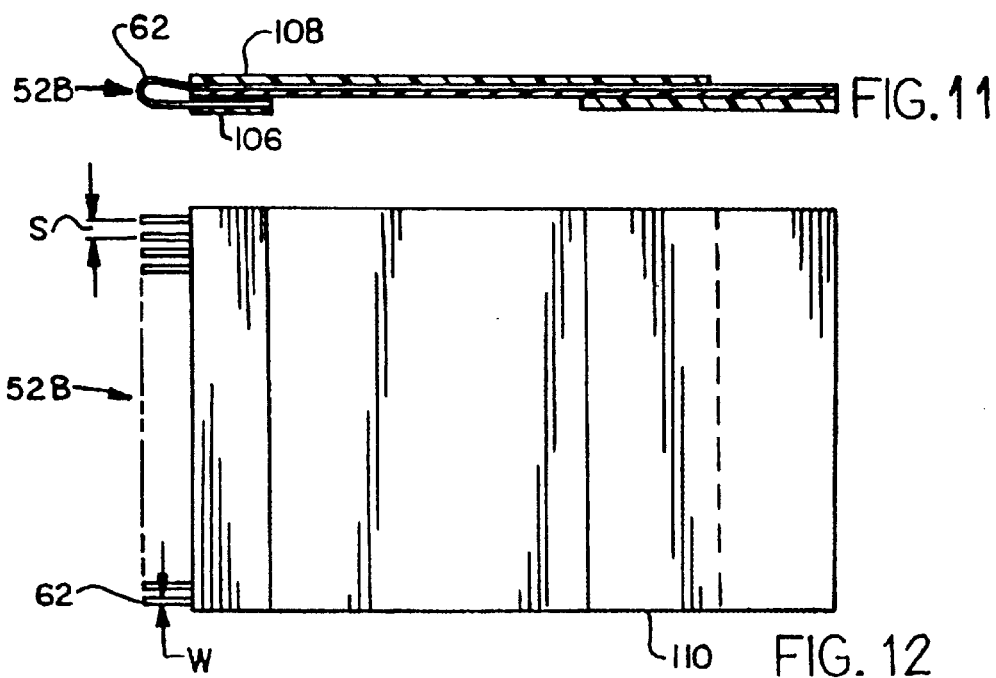
FIG. 11
FIG. 12
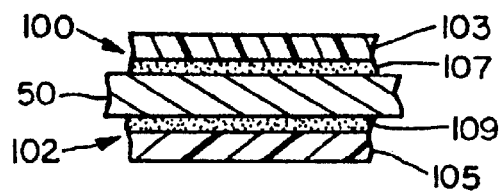
FIG. 12A

CONTACT ARRANGEMENT

CROSS REFERENCE TO RELATED APPLICATION

This is a division of patent application Ser. No. 08/061,097 filed May 14, 1993 now U.S. Pat. No. 5,453,700, which is a continuation-in-part of patent application Ser. No. 07/893,181 filed Jun. 3, 1992, now abandoned.

BACKGROUND OF THE INVENTION

Test clips are used to temporarily connect to the leads of IC (integrated circuit) devices. High density circuits generally have a rectangular body and multiple leads extending from two or four sides of the body to a circuit board. Present test clips use rows of individual contacts, each stamped or photo-fabricated to small tolerances. The contacts are placed in individual slots of a plastic housing, and are separated by thin barriers that form the slots.

IC devices are becoming available with greater numbers of leads spaced closer together. IC devices are currently available with fifty leads on each of four sides, having a 0.5 mm (0.02 inch) lead pitch, which is the center-to-center spacing of the leads. It is expected that IC devices will soon be available with lead pitch sizes of 0.4 mm and 0.3 mm. As the pitch size decreases, the size and tolerance of the very thin contacts and of the insulator barrier walls between adjacent contacts, becomes extremely small. The problem of producing reliable test clips for such miniature IC devices is compounded by the fact that existing IC devices as well as recently announced new ones are not well standardized. A connecting device which enabled test clips to be manufactured at moderate cost to reliably engage the leads of IC devices having leads spaced at very small pitch sizes, would be of considerable value in the testing of IC circuit devices.

SUMMARY OF THE INVENTION

In accordance with one embodiment of the present invention, a connecting device is provided which is especially useful in a test clip which requires multiple conductors with closely spaced contact ends that can reliably make wiping contact with leads or terminals. The connecting device includes a flat flexible cable having a group of elongated conductors held in a fixed relationship by insulation. The conductors extend parallel to each other and are laterally spaced apart, with each conductor having a contact end for engaging a lead or terminal. Each contact end is formed by a portion of a conductor that extends in a loop. The loop configuration results in each contact end being curved, which avoids the presence of sharp edges in very small contact ends.

A test clip can use the flat flexible cable connecting device to engage the largely vertical outer lead parts of a row of leads extending from a side of an IC device. The cable is oriented so the looped conductor ends project downwardly and make wiping contact with the outer lead parts as the test clip is pressed down onto the IC device.

The novel features of the invention are set forth with particularity in the appended claims. The invention will be best understood from the following description when read in conjunction with the accompanying drawings.

BRIEF DESCRIPTION OF THE DRAWINGS

FIG. 9 is a sectional side view of a flat flexible cable of the connecting device of the invention, shown prior to forming of loops at the contact ends thereof.

FIG. 10 is a plan view of the cable of FIG. 9.

FIG. 11 is a sectional side view of the flat flexible cable of FIG. 9, shown after bending to form loops at the contact ends thereof.

FIG. 12 is a bottom view of the cable of FIG. 11.

FIG. 12A is a view of a portion of the cable of FIG. 9.

DESCRIPTION OF THE PREFERRED EMBODIMENTS

Figure 1:
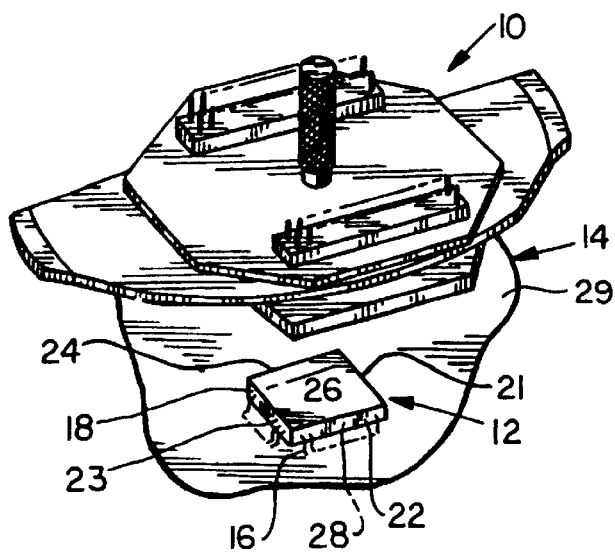
FIG. 1 is a simplified isometric view of a test clip constructed in accordance with the present invention, and showing it lying above an integrated circuit device that is mounted on a circuit board.
Figure 2:
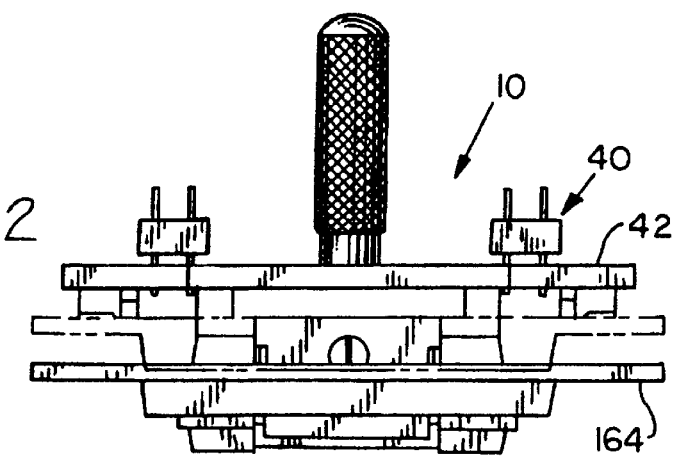
FIG. 2 is a side elevation view of the test clip of FIG. 1.
Figure 3:
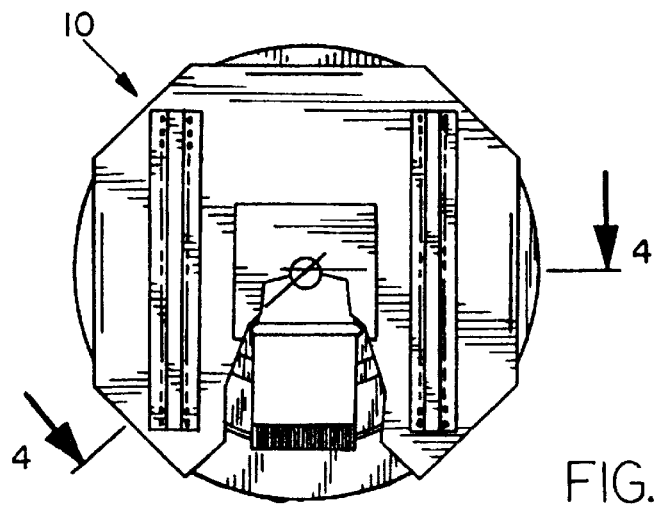
FIG. 3 is a plan view, partially in section, of the test clip of FIG. 2.

FIG. 1 shows a test clip 10 of the present invention, which can be lowered onto a surface mounted IC (integrated circuit) device 12. The IC device has been mounted on a circuit board device, or circuit board 14, of electronic equipment. The particular IC device is a CQFP (ceramic quad flat pack) IC device which includes 100 leads projecting horizontally from a body 18. Twenty five leads project from each of four sides 21–24 of the body. The body has a top 26 that faces upwardly when the circuit board (its upper surface) lies in a horizontal plane, and has a bottom 28 that lies adjacent to the upper face 29 of the circuit board.

Figure 4:
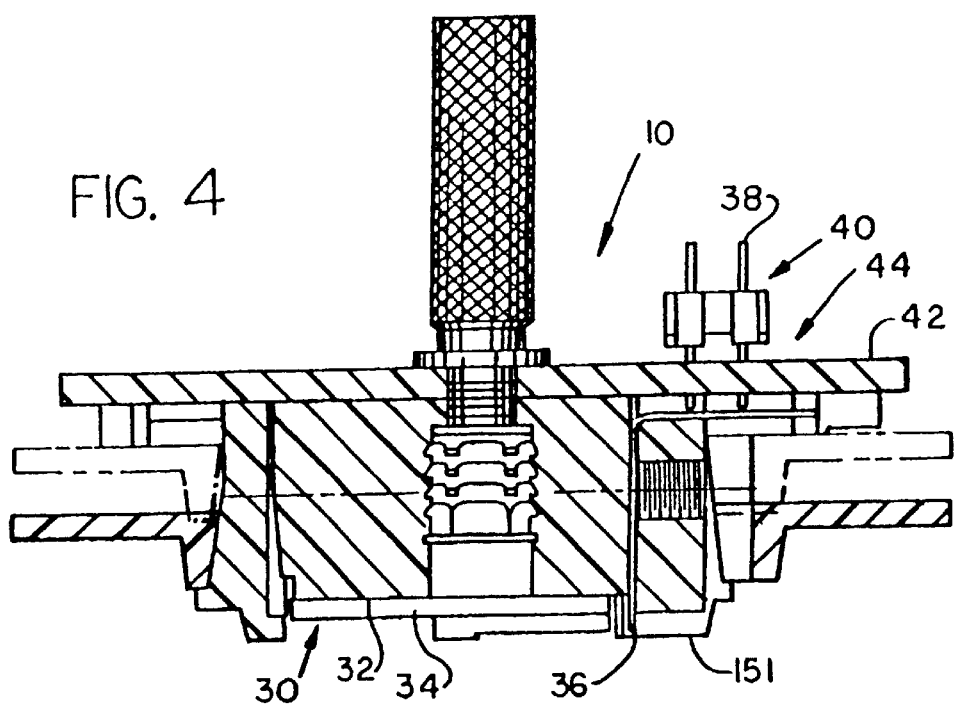
FIG. 4 is a sectional view of the test clip of FIG. 2.

As shown in FIG. 4, the test clip includes a clip housing 30 with locating walls 32, 34 that engage the body of an IC device to accurately locate the test clip with respect to the IC device. The clip has a plurality of lead-engaging contacts 36 which engage the leads of the IC device. The lead-engaging contacts 34 are electrically coupled to contact elements 38 of a connector 40 of the header type. The test clip housing includes a test clip board 42 of a test clip circuit board assembly 44, and the connector 40 is mounted on the board 42.

Figure 6:
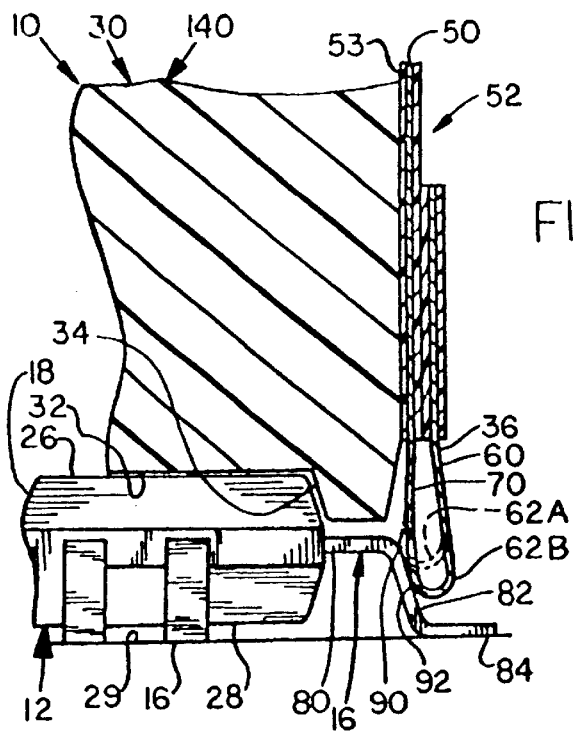
FIG. 6 is an enlarged view of a portion of the connector of FIG. 5, and showing it engaged with an integrated circuit device.
Figure 7:
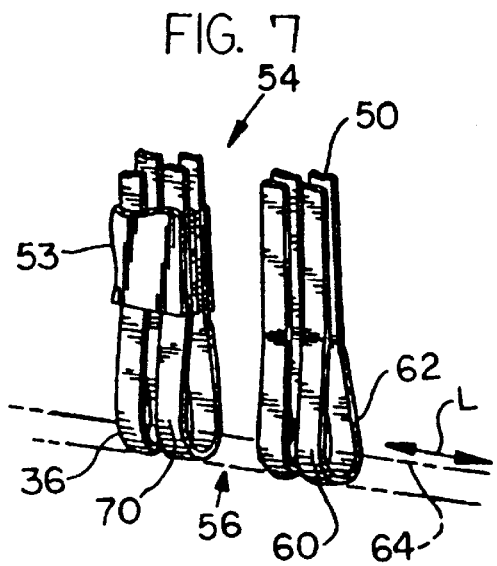
FIG. 7 is a partial isometric sectional view of the connecting device of the test clip of FIG. 6.

As shown in FIG. 6, the lead-engaging contacts 36 which engage leads 16 of the IC device 12, are formed by conductors 50 of a flat flexible cable 52. The flat flexible cable serves as a connecting device with one end that makes temporary engagement with terminals or leads such as the leads 16 of the IC device, and which has another end which connects to other leads or terminals such as the contact elements of the header connector 40 (FIG. 4). The cable 52 (FIG. 6) includes flexible insulation 53 which intimately surrounds at least portions of the conductors. As shown in FIG. 7, a group 54 of conductors which includes the individual conductors 50, are held by the insulation 53 in a fixed relationship wherein the conductors extend parallel to each other and are spaced from each other along a predetermined lateral direction L. The group of conductors has a first end portion forming the contact ends or contacts 36 of the conductors. Lower or first end portions 60 of the conductors are formed in substantially parallel conductor loops 62 that are each curved about an axis 64 extending parallel to the lateral direction.

Figure 8:
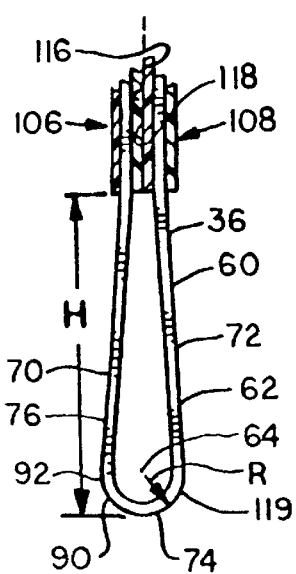
FIG. 8 is a partial elevation view of the connecting device of FIG. 7.

As shown in FIG. 8, each loop includes first and second sides 70, 72 joined by a middle 74. At least the first side 70 of the loop has an exposed outer surface 76. When the test clip 10 of FIG. 6 is installed on the IC device 12 by moving the test clip down, the first side 70 of the loop initially engages a lead 16 of the IC device. Each lead 16 generally has a horizontal upper part 80 and has an outer lead part 82 that extends largely vertically and ends in an outer part 84. When the test clip 10 is moved downwardly towards the IC device, the partially lowered loop at 62A initially engages the outer lead part 82 at an initial contact point 90 (actually line contact may be made) on the first side 70 of the loop. When locating wall 32 engages the top 26 of the IC device body, the loop will have moved down to the position 62B, wherein it engages the outer lead part at a final contact point 92. Both contact points lie on the first side 70 of the loop middle 74. During engagement, the contact loop makes wiping contact with the lead, and the contact loop is also wiped, which encourages low resistance engagement.

Applicant earlier used a flat flexible cable, with exposed lower ends forming a row of contacts, but with the lower ends merely cut. The cutting of the conductor ends can leave burrs or other unevenness. The extreme tip of cut conductors, can lead to the exposed conductor ends "catching" on the leads and not becoming gradually deflected to one side but instead becoming severely bent. Such bending can result in a conductor not engaging a lead of a next IC device to which the test clip is connected. Applicant's provision of a loop results in the lower end of each contact having a gradual curvature, which avoids sharp or burred tips that could catch on a lead or other part. The two sides of the loop support each other through the middle 74, which avoid twisting or other unwanted deformation of the contacts.

FIGS. 9–12 show the manner in which the flat flexible cable connector device 52 is formed. FIGS. 9 and 10 show the cable at 52A, with the conductor 50 not yet bent. The cable includes first and second insulation layers 100, 102, which are interrupted at a gap 104. The gap results in first and second portions 106, 108, with each portion including insulation surrounding each conductor 50. Applicant prefers to provide a stiffening layer of insulation 110 at an upper end 112 of the cable.

FIGS. 11 and 12 show the cable at 52B after its lower end 1 14 has been bent by 180° to form the loops 62. The first and second insulation parts 106, 108 lie facewise adjacent to each other.

As shown in FIG. 8, the first and second insulation parts have faces 116, 118 that lie adjacent to each other. It would be possible to have bare conductor locations at the ends of each loop engage each other, but more secure holding of the conductors is achieved by surrounding each end of the loop with insulation.

In a test clip that applicant has constructed, the flat flexible cable has the initial and final shape shown in FIGS. 6–12. Each conductor 50 has a thickness T (FIG. 9) of 0.075 mm (0.003 inch) and a width W (FIG. 12) of 0.3 mm (0.012 inch). The conductors are spaced apart at a pitch or center-to-center spacing S of 0.5 mm (0.020 inch). With the thickness T of the conductor being less than paper thin, applicant constructs the conductors of beryllium copper, to provide substantial rigidity. Exposed areas of the conductors at the loop 62 and at the upper end of the cable, are both gold plated.

The first and second insulation layers 100, 102 (FIG. 12A) are both formed of films 103, 105 of 0.05 mm thick Kapton, with a bonding film 107, 109 of 0.025 mm thick adhesive thereon. The stiffening layer 110 (FIG. 9) is formed of 0.100 mm thick Kapton, with 0.05 mm thick adhesive thereon. As shown in FIG. 8, the lower end of each loop has an outside radius R of about 0.2 mm (0.009 inch). The opposite sides 70, 72 of the loop above the curved lower end 119 are straight, and the loop has a total height H of about 1.75 mm (0.07 inch).

Figure 5:
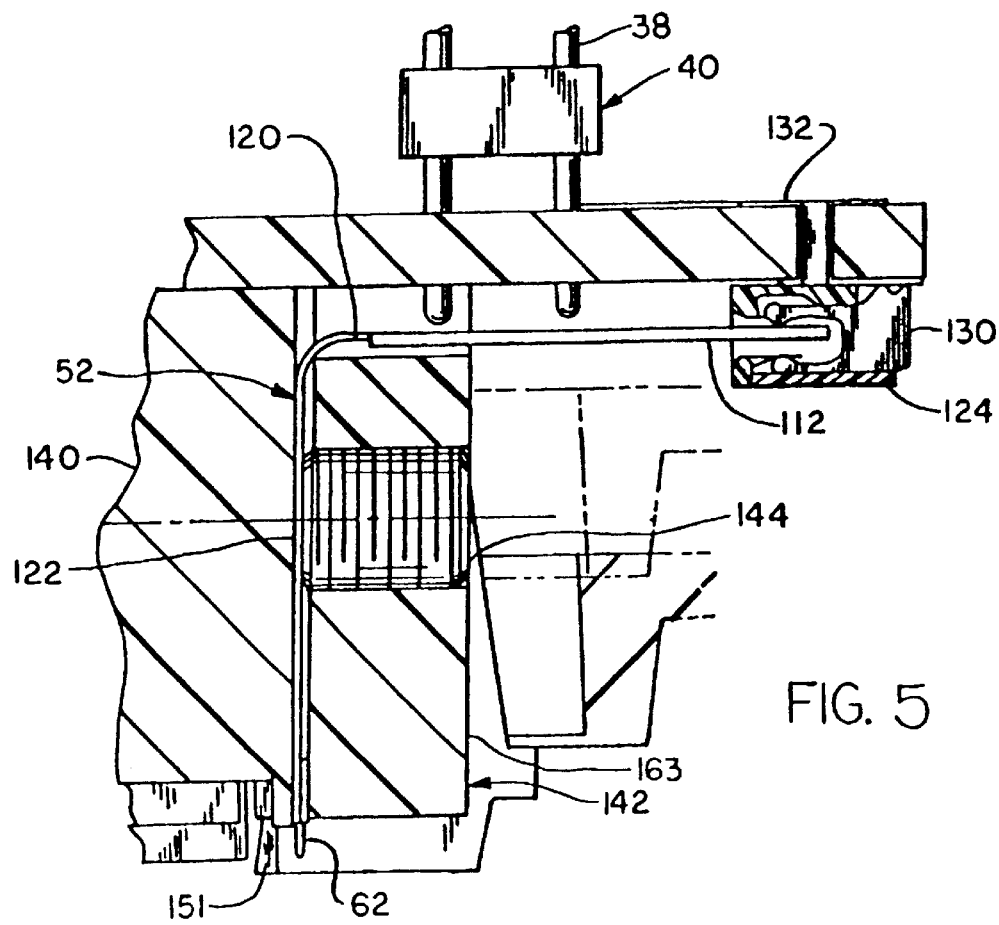
FIG. 5 is a view of a portion of FIG. 4.

As shown in FIG. 5, the flat flexible cable or connector device 52 includes a middle 120 that is bent out of the vertical plane of the cable lower portion 122, and which extends to the upper end 112 of the cable. The upper end of the cable connects to a flexible cable connector 124 which connects each cable conductor to a corresponding contact element 38 of the header connector 40. The flexible cable connector 124 has multiple terminals 130 which connect to the cable conductors and to conductive traces 132 on the circuit board that lead to the contact elements 38. The conductive traces 132 can include trace portions on the lower and upper surfaces of the test clip board 42 and plated-through holes that connect the trace portions. The cable 52 is trapped in place between a base 140 which locates the test clip housing with respect to the IC device, and a hood 142. A set screw 144 in the hood can be tightened to fix a cable location in place.

The use of a flat flexible cable enables the characteristics of the test clip to be easily changed. IC devices are being constructed with ever decreasing lead pitches (spacing between lead centers), with the IC leads constructed by photoetching techniques that enable such decrease. Applicant's use of photoetched conductors in the cable, enables applicant to use the same advances in photoetching technology as are used for IC device leads, to follow the decrease in lead pitch. If the body of a smaller pitch IC device has the same size body (e.g. 14 mm square) but it contains more leads at a smaller pitch (e.g. at 0.3 mm instead of at 0.5 mm), then applicant merely has to change the cable and circuit board. The other parts of the test clip are formed of injection molded parts which entail large tooling costs. However, the flat flexible cable and circuit board do not involve such high tooling costs.

It is generally desirable for the lower end of each cable to press against a lead with a force of about 40 grams (in a direction normal to their surfaces). If the contact force is found to be slightly too large, applicant can alter the cable design by increasing the loop height H (FIG. 8) to make the loop less rigid, or can slightly decrease the radius of curvature R of the loop so the loop is deflected less. Opposite changes compensate for a contact force that is slightly too small. The exact dimensions of the IC device leads can vary from one manufacturer to another, and the cable construction and/or mounting can be adjusted to compensate for such variations.

Figure 13:
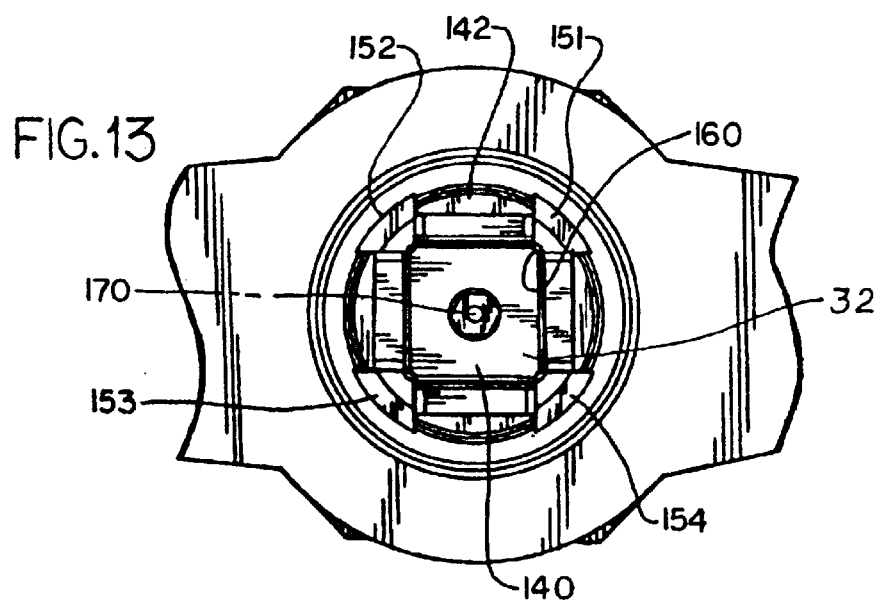
FIG. 13 is a partial bottom view of the test clip of FIG. 2.
Figure 14:
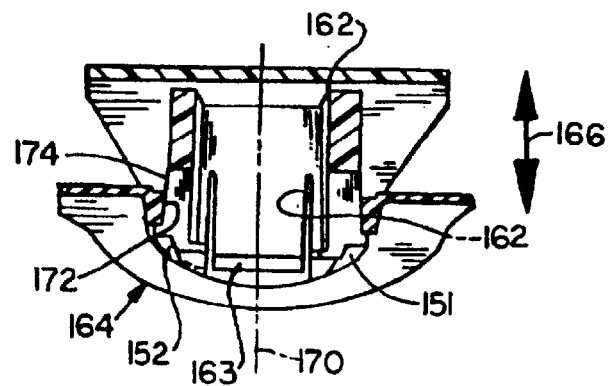
FIG. 14 is a partial isometric view of the test clip of FIG. 13.

FIG. 13 is a view of the bottom of the test clip, showing four fingers 151–154 that lock the test clip to the IC device. Each finger has a lip 160 designed to move under and against the bottom of an IC device to lock the clip to the device. As shown in FIG. 14, each finger such as 151, 152 is part of the hood 142. Slots 162 separate the fingers from four hood sides 163 that locate lower portions of the cable, to allow each finger to pivot. A locking ring 164 surrounds the fingers, with the locking ring being movable vertically as indicated by arrows 166. When the locking ring 164 is moved upwardly, the locking fingers 151–154 can deflect radially outwardly away from the axis 170 of the test clip. When the locking ring moves downwardly, a cam surface 172 on the locking ring pushes against a tapered surface 174 on the fingers to push them together and lock them against corner portions of the bottom of the IC device.

Figure 15:
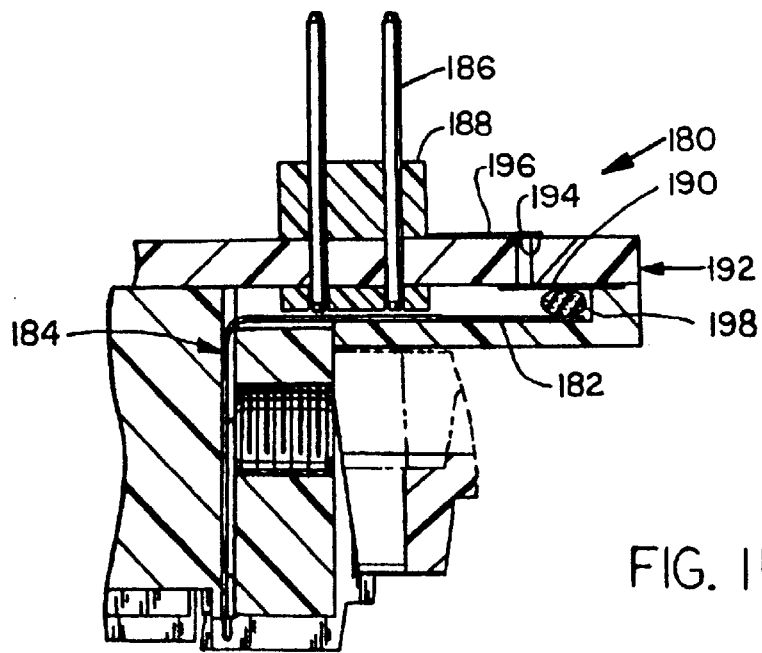
FIG. 15 is a partial sectional view of a test clip constructed in accordance with another embodiment of the invention.

FIG. 15 illustrates a portion of a test clip 180 which is similar to that of FIGS. 1–14, except in the way that the upper end 182 of the flat flexible cable 184 is electrically connected to the header contacts 186 of a header-type connector 188. The upper ends 182 of the conductors are bare, or uncovered by insulation. An elastomeric connector 198 connects the conductors to lower parts 190 of conductive traces on a test clip circuit board 192. The lower trace parts 190 are connected through plated holes 194 to upper trace parts 196 which connect to the header contacts 186. The elastomeric connector 198 is of the prior art type which includes a horizontal stack of elastomeric wafers that are held together, with electrically conductive wafers alternating with insulative wafers; a conductive wafer connects a conductor upper end 182 to a circuit board trace part 190. The connections can be soldered to make them reliable. The connection arrangement of FIG. 15 is relatively simple and compact because it does not use an intermediate flat cable connector. However, in some cases a flat cable connector of the type indicated in FIG. 5, can facilitate reliable connection to the circuit board.

While terms such as "top", "bottom", "vertical", "horizontal" and the like are used herein to aid in describing the invention, it should be understood that the parts can be used in any orientation with respect to gravity.

Thus, the invention provides a connecting device which is especially useful for a test clip, although useful in other applications as well, to provide a row of very small and closely spaced contacts that can readily make and break engagements with leads or terminals. The connecting device comprises a flat flexible cable which includes a group of elongated conductors and which also includes insulation which holds to at least portions of the conductors. The insulation holds the conductor in a fixed relationship wherein they extend parallel to each other and are laterally spaced. First end portions of the contacts extend in substantially parallel conductor loops that are each curved about an axis extending parallel to the lateral direction. The bent loops provide contacts or contact ends that avoid sharp edges. The apparatus is useful primarily for contacts that are spaced apart by no more than about one millimeter, where the ability to use simple flat conductors enables the contacts to be constructed at very low cost, despite the fact that simple flat conductors may not have as desirable mating characteristics as more complexly shaped conductors which can be constructed at moderate cost only in large sizes. A test clip which may include two or four of the flat flexible cables, holds the cables with the conductor loops extending downwardly and positioned to wipe against largely vertical outer lead parts of the leads of an IC device.

Although particular embodiments of the invention have been described and illustrated herein, it is recognized that modifications and variations may readily occur to those skilled in the art, and consequently, it is intended that the claims be interpreted to cover such modifications and equivalents.

I claim:

1. A connecting device for engaging terminals, comprising:

a housing that has a vertically extending wall with a lower end:

a flat flexible cable mounted on said housing, said cable having insulation and a plurality of parallel elongated conductors fixed in position on said insulation, said conductors having lower end portions with surfaces that are exposed to enable them to directly engage said terminals;

said lower end portions of said conductors each lies below said vertically extending wall lower end with each conductor lower end portion extending in a loop wherein said loop has largely parallel opposite loop sides, with each of said conductors being exposed at said first loop side, and with said conductors at said first loop side being positioned to engage a corresponding terminal, and with both of said loop sides being at least partially deflectable to deflect away from a corresponding terminal;

at least one of said loop sides having an upper end extending substantially vertically and being part of a straight cable portion that presses against said vertically extending wall of said housing.

2. The device described in claim 1 wherein:

said conductors are devoid of said insulation in which said conductors are fixed in position, on both sides of each conductor along both of said opposite loop sides.

3. The device described in claim 1 wherein:

said cable has portions (106, 108) that each include part of a conductor, lying above each of said loop sides and forming an extension of each side of the loop, with said extensions lying facewise substantially against each other.

4. The device described in claim 1 wherein:

a terminal engaged with said first loop side;

said at least one of said loop sides is closer, along the length of said cable, to said straight cable portion that presses against said vertical wall than is said second loop side.

5. A connecting device for engaging terminals, comprising:

a housing;

a flat flexible cable having a portion fixed in position on said housing, said cable having an insulative material and a plurality of parallel elongated conductors fixed in position on said insulative material, said conductors having lower end portions with surfaces that are exposed to enable them to directly engage said terminals;

each of said conductor lower end portions extends in a loop of at least about 180°, with each loop having first and second sides, with said first side of each loop being positioned to engage a corresponding terminal, with said loops being free of rigid connection to said housing and with both sides of each loop being deflectable away from a corresponding lead, and with an extension of each side of said loop being mounted in a fixed position and orientation on said housing along a length that is at least about as long as the width of said loop.

6. A connecting device for engaging terminals, comprising:

a housing;

a flat flexible cable having a portion fixed in position on said housing, said cable having an insulative material and a plurality of parallel elongated conductors fixed in position on said insulative material, said conductors having lower end portions with surfaces that are exposed to enable them to directly engage said terminals;

each of said conductor lower end portions extends in a loop of at least about 180°, with a loop middle (74) and opposite loop sides lying on opposite sides of said loop middle, with each loop having a contact point that is positioned to engage a corresponding terminal with each loop being free of rigid connection to said housing and with both sides of each loop being deflectable away from a corresponding terminal, and with a location of each loop where said sides are spaced apart by a maximum amount, being free of any backing material that prevents relative deflection of said loop sides.

7. The connecting device described in claim 5 wherein:

said housing has a vertical wall with a lower end and said loops lie substantially directly below said wall lower end; said extensions of each side of said loop are fixed to said vertical wall.

8. The connecting device described in claim 5 wherein:

said both sides of each loop are free to deflect toward and away from each other.

9. The device described in claim 6 wherein:

said conductors at said loops, are surrounded on all sides only by air.

* * * * *